(12) United States Patent
Cho

(10) Patent No.: US 6,903,797 B2
(45) Date of Patent: Jun. 7, 2005

(54) METHOD OF FABRICATING LIQUID CRYSTAL DISPLAY DEVICE

(75) Inventor: Min Gu Cho, Kumi-shi (KR)

(73) Assignee: LG. Philips LCD Co., LTD, Seoul (KR)

( * ) Notice: Subject to any disclaimer, the term of this patent is extended or adjusted under 35 U.S.C. 154(b) by 71 days.

(21) Appl. No.: 10/323,029

(22) Filed: Dec. 18, 2002

(65) Prior Publication Data

US 2003/0122986 A1 Jul. 3, 2003

(30) Foreign Application Priority Data

Dec. 28, 2001 (KR) .......................................... 2001-86754

(51) Int. Cl.[7] .......................... G02F 1/13; G02F 1/136; G09G 3/36; H01L 29/15
(52) U.S. Cl. .......................... 349/187; 349/43; 345/92; 257/72
(58) Field of Search ..................... 349/43, 187; 257/72; 345/92

(56) References Cited

U.S. PATENT DOCUMENTS

| | | | | |
|---|---|---|---|---|
| 5,276,540 A | * | 1/1994 | Okamoto et al. | 349/39 |
| 5,605,846 A | * | 2/1997 | Ohtani et al. | 438/487 |
| 6,274,932 B1 | * | 8/2001 | Mikagi | 257/754 |
| 6,355,943 B1 | * | 3/2002 | Sung | 257/72 |

* cited by examiner

Primary Examiner—Tarifur R. Chowdhury
Assistant Examiner—Hoan Chau Nguyen
(74) Attorney, Agent, or Firm—Brinks Hofer Gilson & Lione

(57) ABSTRACT

Disclosed is a method of fabricating a liquid crystal display device enabling to form a uniform gate insulating layer in thickness. The present includes the steps of forming a gate line, a gate electrode, and a storage line on a substrate and forming a gate insulating layer on the substrate including the gate line and the gate electrode using first and second gases having a gas mixture ratio of 0.3~0.5:1. And, the first and second gases are mono-silane($SiH_4$) and ammonia($NH_3$), respectively. Accordingly, the present invention enables a uniformly thick gate insulating layer, thereby to improving the discharging time as well as reducing flicker on the screen.

8 Claims, 4 Drawing Sheets

METHOD OF FABRICATING LIQUID CRYSTAL DISPLAY DEVICE

This application claims the benefit of the Korean Application No. P2001-86754 filed on Dec. 28, 2001, which is hereby incorporated by reference.

BACKGROUND OF THE INVENTION

1. Field of the Invention

The present invention relates to a method of fabricating a liquid crystal display device enabling formation a uniform gate silicon nitride insulating layer by increasing the airflow of a mono-silane gas when the gate insulating is being deposited.

2. Discussion of the Related Art

Generally, liquid crystal display devices are widely used because they are compact and thin size as well as light weight. Typically, liquid crystal display devices have a great contrast ratio, and are suitable for both gray scale and moving picture display. In addition, liquid crystal displays consume less power than alternate display, notably CRTs (cathode ray tube).

Such a liquid crystal display device includes a thin film transistor substrate having thin film transistors and pixel electrodes in pixel areas defined by gate and data lines, a color filter substrate having a color filter layer and a common electrode, and a liquid crystal layer inserted between the thin film transistor and color filter substrates.

The typical liquid crystal display generally includes two substrates having electric field generating electrodes formed thereon respectively to confront each other and liquid crystals injected between the two confronting substrates. If a voltage is applied to the electrodes to generate an electric field, liquid crystals molecules are driven to display an image in accordance with light transmittance varied by the electric field.

There are various types of the liquid crystal displays. Recently an active matrix liquid crystal display(AM-LCD) on which thin film transistors and pixel electrodes connected to each other are arranged in a matrix have been receiving heightened attention as they provide excellent resolution and implementation of moving pictures.

Such a liquid crystal display contains pixel and common electrodes that are formed on lower and upper substrates, respectively, and drives the liquid crystal molecules by applying an electric field between the substrates in a direction perpendicular to the substrates.

A liquid crystal display according to a related art is explained by referring to the attached drawings as follows.

Referring to FIG. 1, a plurality of gate lines 11 are |formed in one direction on a lower array substrate 10 of a liquid crystal display and a gate electrode 12 protrudes from one side of each of the gate lines 11.

A plurality of data lines 14 are formed perpendicular to the gate lines 11, and cross with the gate lines 11 to define pixel areas, respectively.

A source electrode15 protrudes from one side of each of the data lines 14, and a drain electrode 16 is separated from the source electrode 15 to leave a predetermined interval.

Moreover, the source, drain, and gate electrodes 15, 16, and 12 form a thin film transistor T including an active layer of amorphous silicon13 over the gate electrode 12.

The source and drain electrodes 15 and 16 overlap both upper sides of the gate electrode 12.

A pixel electrode 18 made of a transparent conductive material is formed on each of the pixel areas to overlap the drain electrode 16 in part, and a contact hole 17 is formed at the portion where the pixel and drain electrodes 18 and 16 overlap with each other.

Meanwhile, a storage capacitor Cst is formed to maintain a cell voltage.

In this case, an upper electrode of the storage capacitor Cst is formed of an opaque metal layer 14a having a predetermined pattern and a lower electrode of the storage capacitor Cst is formed of the gate line 11 at the front end.

The opaque metal layer 14a is formed to overlap the gate line 11 at the front end in part when the data line 14 is formed, and partially overlaps the pixel electrode 18.

In addition, a contact hole 17a exposing a predetermined portion of the opaque metal layer 14a is formed together with the previous contact hole 17. Hence, the gate line 11, opaque metal layer 14a, and an insulating layer 22 (shown in FIG. 2), which is inserted between the gate line 11 and opaque metal layer 14a, form the storage capacitor Cst when a voltage is applied to the pixel electrode 18.

A storage-on-gate system is shown in the drawing, and a lower electrode of the storage capacitor is integral with the gate line at the front end.

A cross-sectional view of such an array substrate is shown in FIG. 2 illustrating a cross-sectional view along a cutting line V–V' in FIG. 1, in which a storage electrode part A and a thin film transistor part B are separated from each other for explanation. And, the same elements are indicated by the same numerals.

Referring to FIG. 2, a gate line 11 is formed in the storage electrode part A on a lower array substrate 10 and a gate electrode 12 extending from the gate line 11 is formed in the thin film transistor part B.

A gate insulating layer 22 is formed on an entire surface of the storage electrode and thin film transistor parts A and B.

And, an active layer 13 is formed in a thin film transistor forming area on the gate insulating layer 22 of the thin film transistor part B.

The active layer 13 includes an amorphous silicon layer 13a and a doped semiconductor layer 13b on the amorphous silicon layer 13a for ohmic contact and etch prevention.

Source and drain electrodes 15 and 16 are arranged to overlap both side ends of the doped semiconductor layer 13b, respectively.

In this case, the source electrode 15 is an electrode extending from the data line 14, and the drain electrode 16 is isolated from the source electrode 15.

Besides, an opaque metal layer 14a that overlap the gate line11 is formed in the storage electrode part A simultaneously when the source and drain electrodes 15 and 16 are formed.

A passivation layer 24 is formed on an entire surface of the substrate 10 having the opaque metal layer 14a and source/drain electrodes 15/16 formed thereon.

Contact holes 17 and 17a exposing predetermined portions of the drain electrode 16 and opaque metal layer 14a respectively are formed in the passivation layer 24. And, a pixel electrode 18 made of a transparent material is formed on the passivation layer 24 in the pixel area to contact the drain electrode 16 and opaque metal layer 14a.

In the above-constituted liquid crystal display device, the gate insulating and passivation layers 22 and 24 have great influence on the storage capacitance Cst between the gate line 11 and pixel electrode 18.

The storage capacitance Cst plays a role in uniformly maintaining the voltage applied to the pixel electrode 18, and the gate insulating layer 22 is the most important factor that affects electric characteristics of the thin film transistor.

Moreover, the gate insulating layer 22 demands a high insulating characteristic between the gate electrode 12 and active layer 13 while the voltage is not applied thereto, and uses a thin insulating layer material having stable characteristics as well as a good breakdown voltage.

Typically, silicon oxide ($SiO_2$), silicon nitride ($SiN_x$) or the like is widely used to form the gate insulating layer 22.

However, silicon oxide has a slow deposition rate when the layer is formed for fabricating a thin film transistor(TFT) and has a low breakdown voltage for insulation. Hence, the silicon nitride layer is commonly used as the material of the insulating layer.

A method of forming a silicon nitride layer according to a related art is explained as follows.

First of all, the silicon nitride layer is formed by plasma enhanced chemical vapor deposition (PECVD) using a gas mixture of mono-silane ($SiH_4$) and ammonia ($NH_3$).

For instance, the silicon nitride layer is formed by mixing 320 sccm(standard cubic cm/min) of a mono-silane($SiH_4$) gas and 1,200 sccm of an ammonia($NH_3$) gas with each other at a mixing ratio of about 0.27:1.

The silicon nitride layer prepared using the mixed raw material gas with the mixing ratio can be used as the gate insulating layer as well as the passivation layer.

In order to form a silicon nitride layer fitting the characteristics of the gate insulating and passivation layers, a more reasonable process of fabricating the silicon nitride layer is demanded.

A process of depositing a silicon nitride layer according to a related art is explained in detail as follows.

FIG. 3 illustrates a diagram of a deposited thickness of a silicon nitride layer according to a related art.

Referring to FIG. 3, a contour line is used in the drawing so that a horizontal direction indicates a horizontal length of a substrate, a vertical direction indicates a vertical length of the substrate, and a height direction indicates a thickness of a silicon nitride layer.

In the drawing, the silicon nitride layer according to the related art is deposited thick in the central portion of the substrate and tends to become thinner toward the edges of the substrate.

Namely, in a single substrate including several liquid crystal cells A, B. C, D, E, and F, as shown in FIG. 4, the silicon nitride layer is deposited thin on peripheries of the liquid crystal cells C, D, E, and F corresponding to both sides of the substrate.

FIG. 5 illustrates a graph of a cross-section along a cutting line I~I' in FIG. 3.]

Referring to FIG. 5, a horizontal axis is a horizontal length of a substrate and a vertical axis indicates a measured value of a silicon nitride layer thickness 25.

The silicon nitride layer thickness is measured in units of "Å". As mentioned in the foregoing explanation, the silicon nitride layer is deposited thick in the central portion of the substrate and becomes thinner toward the edges of the substrate. Hence, a difference in thickness between the central portion and edge of the substrate is about 500 Å.

However, the process of depositing the silicon nitride layer according to the related art has the following problems or disadvantages.

First of all, when the thickness of the silicon nitride layer deposited in the central portion fails to be uniform with that in the edge portion, the gate insulating layer inserted between the gate line and pixel electrode brings about a storage capacitance fluctuation.

Such a storage capacitance fluctuation makes each area differ in capability of maintaining a voltage, whereby an image displayed on a screen fails to disappear the moment power turns off. Specifically, the image on the edge of the substrate in which the silicon nitride layer is thin turns off slowly due to the increased capacitance.

Secondly, the thickness difference in the gate insulating layer brings about a capacitance difference of the thin film transistor.

Such a capacitance difference is mainly affected by the impurities in the gate insulating layer but is an important variable for determining the value of threshold voltage when a channel is formed in the semiconductor layer.

Hence, the deviation according to the thickness of the silicon nitride layer may have influence on the value of threshold voltage.

Finally, the capacitance difference caused by the thickness difference of the gate insulating layer triggers a difference of parasitic capacitance due to the thickness of the gate insulating layer, whereby a data voltage applied to the pixel electrode varies to make the image flicker.

SUMMARY OF THE INVENTION

Accordingly, the present invention is directed to a method of fabricating a liquid crystal display device that substantially obviates one or more problems due to limitations and disadvantages of the related art.

An object of the present invention is to provide a method of fabricating a liquid crystal display device enabling formation of a uniform gate insulating layer by adjusting a gas mixture of mono-silane($SiH_4$) and ammonia($NH_3$) to 0.3~0.5:1 when a silicon nitride layer is deposited.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a liquid crystal display device according to the present invention includes the steps of forming a gate line, a gate electrode, and a storage line on a substrate, and forming a gate insulating layer on the substrate including the gate line and the gate electrode using first and second gases having a gas mixture ratio of 0.3~0.5:1.

Preferably, the gate insulating layer is formed by plasma enhanced chemical vapor deposition.

Preferably, the first and second gases are mono-silane ($SiH_4$) and ammonia($NH_3$), respectively.

Preferably, the gate insulating layer is a silicon nitride layer.

More preferably, the mono-silane($SiH_4$) and ammonia ($NH_3$) have 400~600 sccm and 1,200 sccm, respectively.

Preferably, the present invention further includes the steps of forming a semiconductor layer, a source electrode, and a drain electrode on the gate insulating layer, forming a passivation layer on the source and drain electrodes, forming a pixel electrode on the passivation layer to be connected to the drain electrode, and forming an alignment layer on the pixel electrode.

Thus, the present invention is characterized in that the specification for depositing the silicon nitride layer is adjusted to attain the gate insulating layer deposited on an entire surface of the substrate uniformly.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A method of fabricating a liquid crystal display device according to a preferred embodiment of the present invention is explained as follows.

First of all, a conductive metal is deposited on a substrate, and then a gate line, a gate electrode, and a storage line are formed on the substrate by photolithography.

In this case, the gate line formed to be arranged in one direction, the gate electrode is formed to protrude from one side of the gate line, and the storage line is built in one body with the gate line in the front end.

Subsequently, a gate insulating layer is formed on the substrate including the gate line and the gate electrode by plasma enhance chemical vapor deposition using a mono-silane($SiH_4$) gas having a high flow.

Thereafter, a semiconductor layer is formed to have an island shape on the gate insulating layer confronting the gate electrode.

A data line is formed to cross with the gate line to define a pixel area, and simultaneously, source and drain electrodes are formed on the gate insulating layer to be overlapped with both sides of the semiconductor layer.

Next, a passivation layer is formed on an entire surface of the substrate including the source and drain electrodes and contact holes formed appropriately.

Subsequently, a pixel electrode is formed on the passivation layer to be connected to the drain electrode.

Finally, a first alignment layer is formed on an entire surface of the substrate having the pixel electrode formed thereon.

In forming the gate insulating layer, a gas mixture ratio between first and second gases is preferably 0.3~0.5:1 in the plasma enhanced chemical vapor deposition.

In this case, the first and second gases are mono-silane ($SiH_4$) and ammonia($NH_3$), respectively.

For instance, the silicon nitride layer is deposited by mixing the mono-silane($SiH_4$) and ammonia($NH_3$) to have 400~600 sccm and 1,200 sccm, respectively.

Preferably, the flow of the mono-silane($SiH_4$) gas is 450 sccm.

The deposited silicon nitride layer according to the present invention is explained by referring to the attached drawings as follows.

Figure 1:
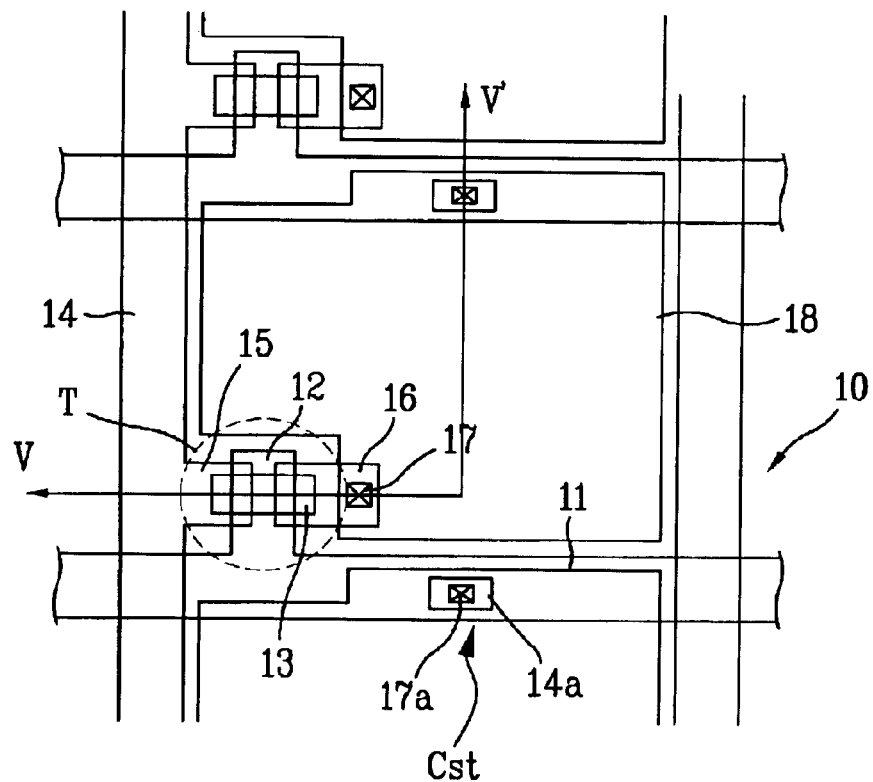
FIG. 1 illustrates a layout of a liquid crystal display according to a related art.
Figure 2:
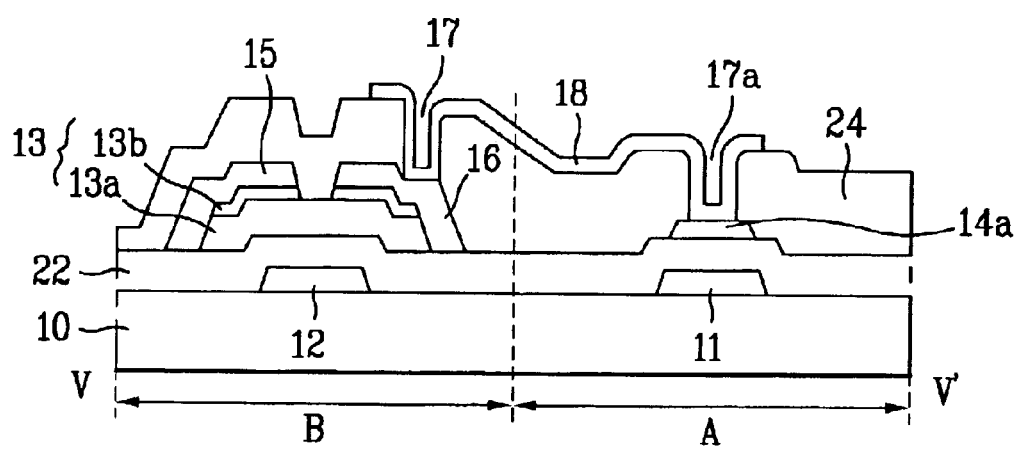
FIG. 2 illustrates a cross-sectional view of a liquid crystal display bisected along a cutting line V–V' in FIG. 1.
Figure 3:
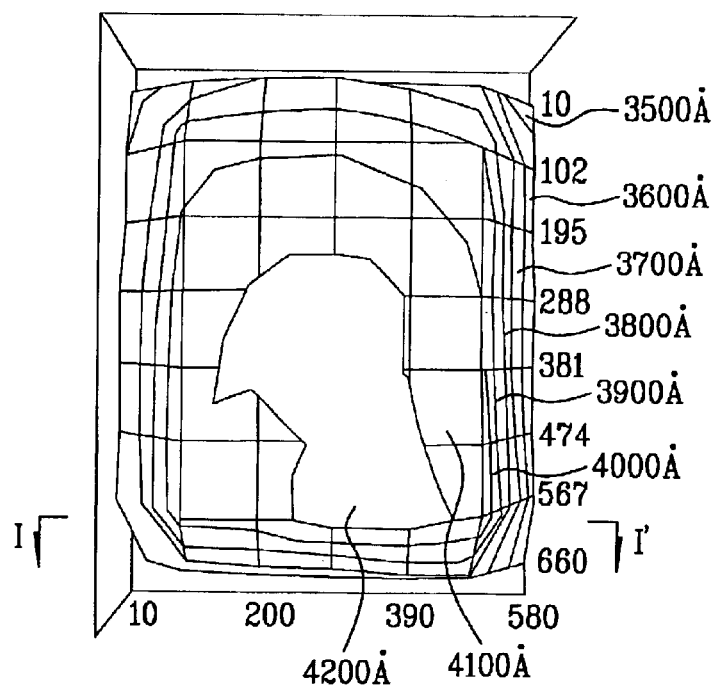
FIG. 3 illustrates a diagram of a deposited thickness of a silicon nitride layer according to a related art.
Figure 4:
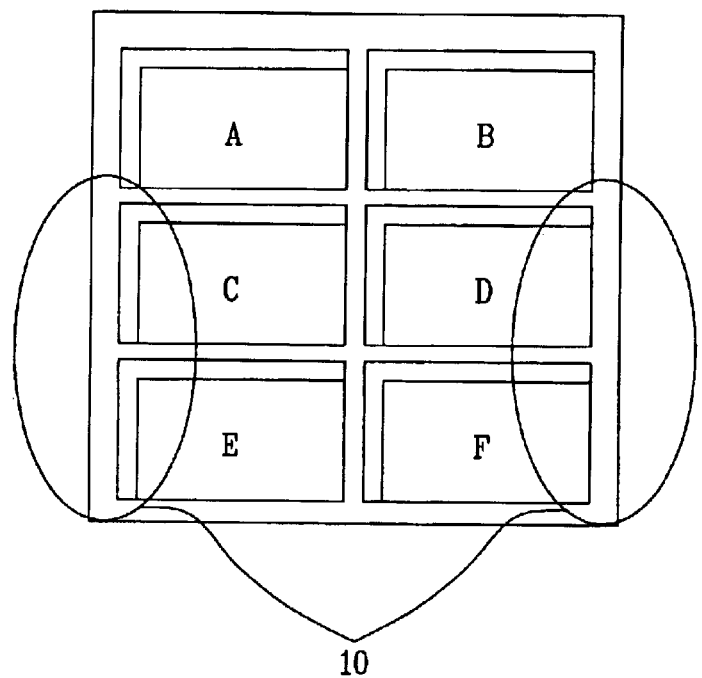
FIG. 4 illustrates a layout of liquid crystal cells schematically.
Figure 5:
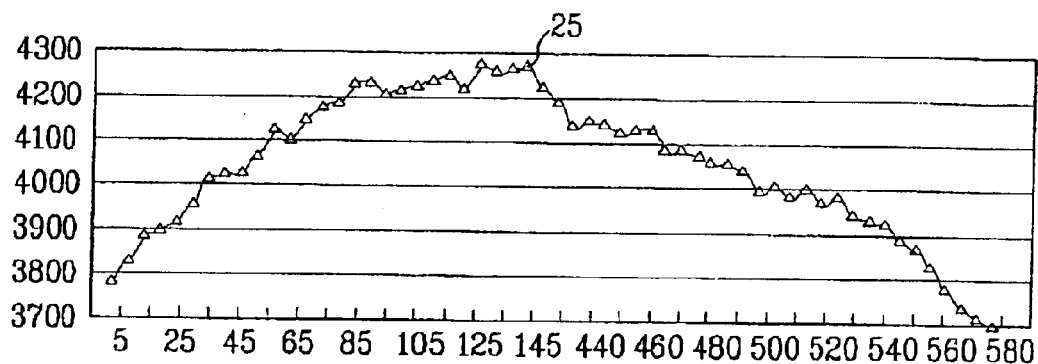
FIG. 5 illustrates a graph of a cross-section along a cutting line I~I' in FIG. 3.
Figure 6:
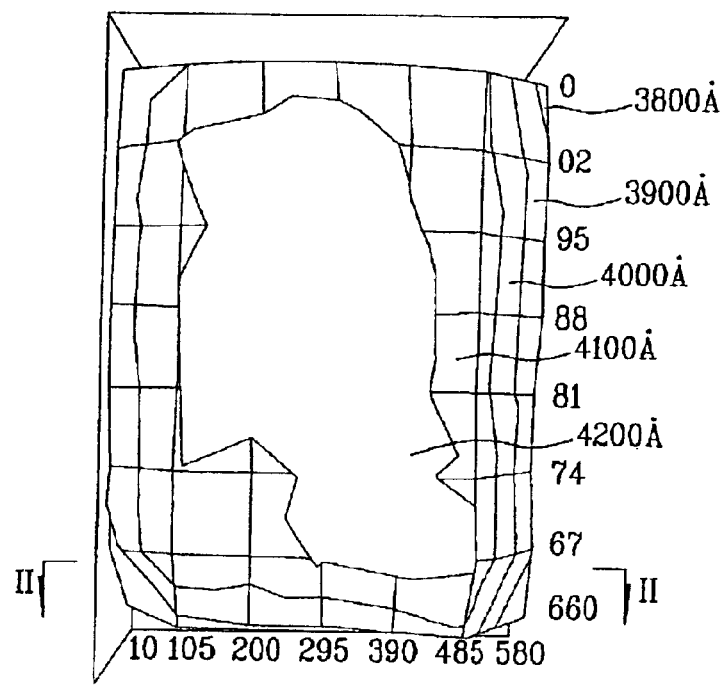
FIG. 6 illustrates a diagram of a deposited thickness of a silicon nitride layer according to the present invention.

FIG. 6 illustrates a diagram of a deposited thickness of a silicon nitride layer according to the present invention.

Referring to FIG. 6, a silicon nitride layer deposited by the specification for the deposition of the silicon nitride layer according to the present invention has a uniform thickness of an entire surface of a substrate, and has a very small deviation difference between a horizontal thickness and a vertical thickness. Hence, it can be seen that the silicon nitride layer is deposited uniformly.

Figure 7:
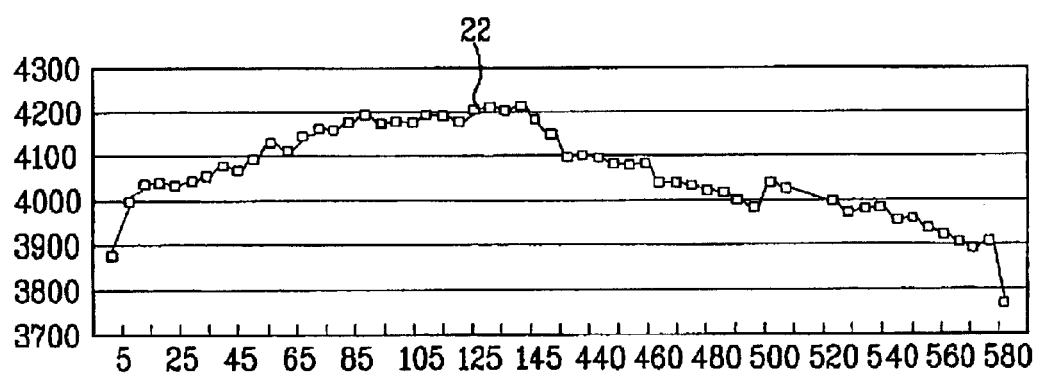
FIG. 7 illustrates a graph of a cross-section along a cutting line II~II' in FIG. 6.

FIG. 7 illustrates a graph of a cross-section along a cutting line II~II' in FIG. 6.

Referring to FIG. 7, a measured value 22 of thickness of a silicon nitride layer according to the present invention has a uniform distribution overall despite small difference.

The improve thickness deviation of the silicon nitride layer according to the present invention is compared to that of the related art, which is explained as follows.

Figure 8:
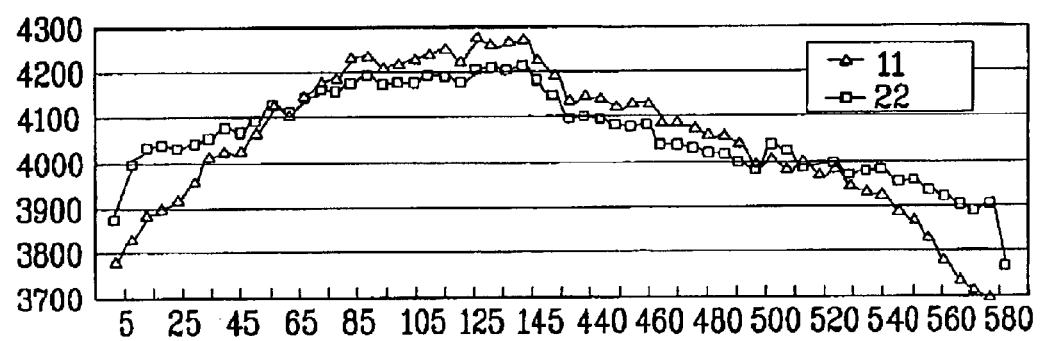
FIG. 8 illustrates a comparison graph between FIG. 5 and FIG. 7.

FIG. 8 illustrates a comparison graph between silicon nitride layers according to the related art and the present invention.

Referring to FIG. 8, a measured value 22 of a thickness of a silicon nitride layer according to the present invention has a deviation smaller than that of the related art, and the silicon nitride layer of the present invention has a uniform thickness.

First of all, the silicon nitride layer deposited by the method according to the present invention shows such an effect as the small thickness deviation at the edge of the substrate.

Moreover, as the thickness deviation decreases, the deviation of storage capacitance is reduced to decrease a discharging time difference.

The discharging times are compared to each other using the deviation in accordance with the thickness, which is explained as follows.

Table 1 is a comparison between the related art and the present invention.

TABLE 1

| Classification | Related art | Present invention |
| --- | --- | --- |
| Unit | ≦12% | ≦8% |
| Discharging time | ≦15 sec | ≦5 sec |

In Table 1, a reference of unit is taken by dividing a difference between minimum and maximum values in thickness except 100 mm of both edges of a substrate by an averaged value and multiplying the divided result by 50 to represent a percentage.

Accordingly, the silicon nitride layer, which is deposited by the method of fabricating the thin film transistor according to the present invention, has a reduced thickness deviation, which decreases the deviation of storage capacitance, thereby enabling a reduction in the discharging time difference.

Moreover, the method of fabricating the thin film transistor according to the present invention reduces the thickness difference of the gate insulating layer to provide a uniform value of threshold voltage and decreases the deviation of parasitic capacitance due to the thickness of the gate insulating layer to reduce flicker on the screen.

Accordingly, the method of fabricating the liquid crystal display device according to the present invention has the following effects or advantages.

Firstly, the thickness deviation of the silicon nitride layer is reduced to decrease the deviation of the storage capacitance, whereby the discharging time difference is reduced.

Secondly, the present invention reduces the thickness difference of the gate insulating layer to provide a uniform value of threshold voltage and decreases the deviation of parasitic capacitance due to the thickness of the gate insulating layer to reduce flicker on the screen.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a liquid crystal display device, comprising: forming a gate line, and a gate electrode on a substrate; and forming a gate insulating layer on the substrate including the gate line and the gate electrode using first and second gases, said first gas containing mono-silane ($SiH_4$), said second containing ammonial($NH_3$), wherein said first gas has a flow rate of about 400 to about 600 sccm and said second gas has a flow rate of 1200 sccm.

2. The method of claim 1, wherein the gate insulating layer is formed by plasma enhanced chemical vapor deposition.

3. The method of claim 1, wherein the gate insulating layer is a silicon nitride layer.

4. The method of claim 1, further comprising forming a semiconductor layer, a source electrode, and a drain electrode on the gate insulating layer.

5. The method of claim 4, further comprising forming a passivation layer on the source and drain electrodes.

6. The method of claim 5, further comprising forming a pixel electrode on the passivation layer to be connected to the drain electrode.

7. The method of claim 6, further comprising forming an alignment layer on the pixel electrode.

8. The method of claim 1, wherein said first gas has a flow rate of about 450 sccm.

* * * * *